United States Patent
Kim et al.

[11] Patent Number: 6,041,733
[45] Date of Patent: Mar. 28, 2000

[54] PLASMA PROCESSING APPARATUS PROTECTED FROM DISCHARGES IN ASSOCIATION WITH SECONDARY POTENTIALS

[75] Inventors: Chang-sik Kim; Jin-ho Park; Kyeong-seob Moon; Young-ho Seo; Tae-hyung Lim; Byung-mook Choi; Ju-ho Kim, all of Kyonggi-do, Rep. of Korea

[73] Assignee: Samsung Electronics, Co., Ltd., Suwon, Rep. of Korea

[21] Appl. No.: 08/957,054

[22] Filed: Oct. 24, 1997

[30] Foreign Application Priority Data

Oct. 24, 1996 [KR] Rep. of Korea ................. 96-48019
Apr. 14, 1997 [KR] Rep. of Korea ................. 97-13580

[51] Int. Cl.[7] .................... C23C 16/00; C23C 14/00; C23F 1/02

[52] U.S. Cl. ............ 118/723 E; 156/345; 204/298.02; 204/298.06; 204/298.31; 204/298.34

[58] Field of Search .............. 156/345; 204/298.34, 204/298.31, 298.06, 298.02; 118/723 E

[56] References Cited

U.S. PATENT DOCUMENTS

| | | | |
|---|---|---|---|
| 5,558,717 | 9/1996 | Zhao et al. | 118/715 |
| 5,567,243 | 10/1996 | Foster et al. | 118/730 |
| 5,643,394 | 7/1997 | Maydan et al. | 156/345 |
| 5,882,414 | 3/1999 | Fong et al. | 118/723 R |
| 5,885,402 | 3/1999 | Esquibel | 156/345 |

*Primary Examiner*—David Lacey
*Assistant Examiner*—Drew Becker
*Attorney, Agent, or Firm*—Marger Johnson & McCollom, P.C.

[57] ABSTRACT

A plasma processing apparatus such as a plasma etching apparatus, which is not subject to arcing to the gas distributor plate which is caused by secondary potentials generated by polymers adhering to a gas distribution plate. The gas distribution plate is electrically isolated from the ground electric potential, and does not have any polarity. The gas distribution plate may be formed of an insulating material. Furthermore, a support plate may be adapted to fix the gas distribution plate to a chamber of the apparatus in such a manner that the gas distribution plate is detachably coupled with the support plate. Thereby, it is easier to separate the gas distribution plate from the apparatus to remove the accumulated polymers during the plasma process.

21 Claims, 4 Drawing Sheets

PLASMA PROCESSING APPARATUS PROTECTED FROM DISCHARGES IN ASSOCIATION WITH SECONDARY POTENTIALS

BACKGROUND OF THE INVENTION

1. Field of the Invention

The present invention relates to a plasma processing apparatus, and more particularly to a plasma reactor chamber having a gas distribution plate (GDP) which is electrically isolated from the electrodes.

2. Description of the Related Art

The requirements for increased device density and greater resolution in semiconductor integrated circuits are continually increasing. A parallel-plate plasma etching process is considered as one of the most widely used processes for semiconductor IC fabrication because it allows for high density and high-resolution patterning of semiconductor substrates.

Such a parallel-plate plasma etching process is performed in a plasma etching apparatus including a vacuum chamber having an upper plate electrode and a lower plate electrode attached to a power supply. The two plate electrodes are parallel and opposed to each other. A semiconductor wafer, which has usually been patterned using conventional photoresist techniques, is placed atop the lower plate electrode. An etching gas is introduced into the chamber, and a high frequency field is generated between the parallel-plate electrodes to generate a plasma from the etching gas. The plasma is driven by the electric field to the surface of the wafer, etching any unmasked areas of the wafer to form the desired pattern thereon.

A conventional plasma etching apparatus is schematically illustrated in FIG. 1. The apparatus includes a vacuum chamber 1. A semiconductor substrate 2 is disposed in the chamber 1. The semiconductor substrate 2 may include a polycrystalline silicon film layer thereon which has been patterned using standard photoresist techniques. The semiconductor substrate 2 is placed on a cathode 4 which serves as a support for the substrate 2, and which is also connected to a high-frequency power supply 3. A top lid 6 is installed at a location opposed to the substrate 2. A GDP 5 is attached to the top lid 6. The GDP 5 includes a plurality of gas nozzles 5a to uniformly introduce a reactive etching gas, for example, a chlorine gas, to the substrate 2. The top lid 6 is connected to ground potential. Accordingly, the GDP 5 is also grounded. The GDP 5 is generally formed from soft anodized aluminum which is produced by coating an aluminum metal with an electrolyzed compound, using conventional sulfuric acid eletrolytic techniques, for example. The GDP 5 is connected to the top lid 6 by screws. The vacuum chamber 1 further includes a gas exhausting device 14 for discharging gas therefrom and a gas inletting device 12 for introducing a reactive etching gas thereinto.

However, there are several disadvantages of the conventional plasma etching apparatus. First, secondary potentials ($V_p$) are formed in the region beneath the GDP 5 as a result of polymers accumulating in the chamber 1 as schematically shown in FIG. 2. The secondary potentials $V_p$ repeatedly increase until they are periodically discharged by arcing to the GDP 5. The GDP 5 is generally coated with an insulator to a thickness of approximately 0.5 $\mu$m. As a result of geometric factors, during the coating process the edges of the gas nozzles of the GDP 5 are only coated to a thickness of 0.3 $\mu$m. As a result, the edges of the gas nozzles are more quickly etched by high-frequency power and an etching gas, and the aluminum metal of the quickly etched area is exposed. Afterwards, these exposed "corners" of uninsulated aluminum promote arcing which generates contaminant particles which contaminate the surface of the wafers, resulting in degradation of the wafer quality. Second, the periodic discharge of the secondary potentials causes fluctuations in the state of the plasma itself, which further decreases the uniformity of the surfaces of the wafers.

SUMMARY OF THE INVENTION

It is therefore an object of the present invention to provide a plasma processing apparatus for suppressing the defects of wafers due to particles which are generated by periodic discharges of secondary potentials in the chamber.

It is another object of the present invention to provide a plasma processing apparatus for enhancing the uniformity of the surfaces of the wafers by preventing fluctuations of the state of the plasma which result from the discharges of the secondary potentials.

According to the present invention, a gas distribution plate located between a first electrode and a second electrode opposed to the first electrode in the chamber is electrically isolated from the first and the second electrodes. Preferably, the gas distribution plate is electrically isolated from the second electrode and sidewalls of the chamber by an insulating material inserted therebetween. Alternatively, the gas distribution plate may be formed of an insulating material, for example, a ceramic material or quartz and so on.

The present invention will now be described more fully hereinafter with reference to the accompanying drawings.

DETAILED DESCRIPTION OF THE PREFERRED EMBODIMENTS

The plasma etching apparatus according to the present invention, as well as a preferred mode of use, will be described in detail, referring to the accompanying drawings.

Figure 3:
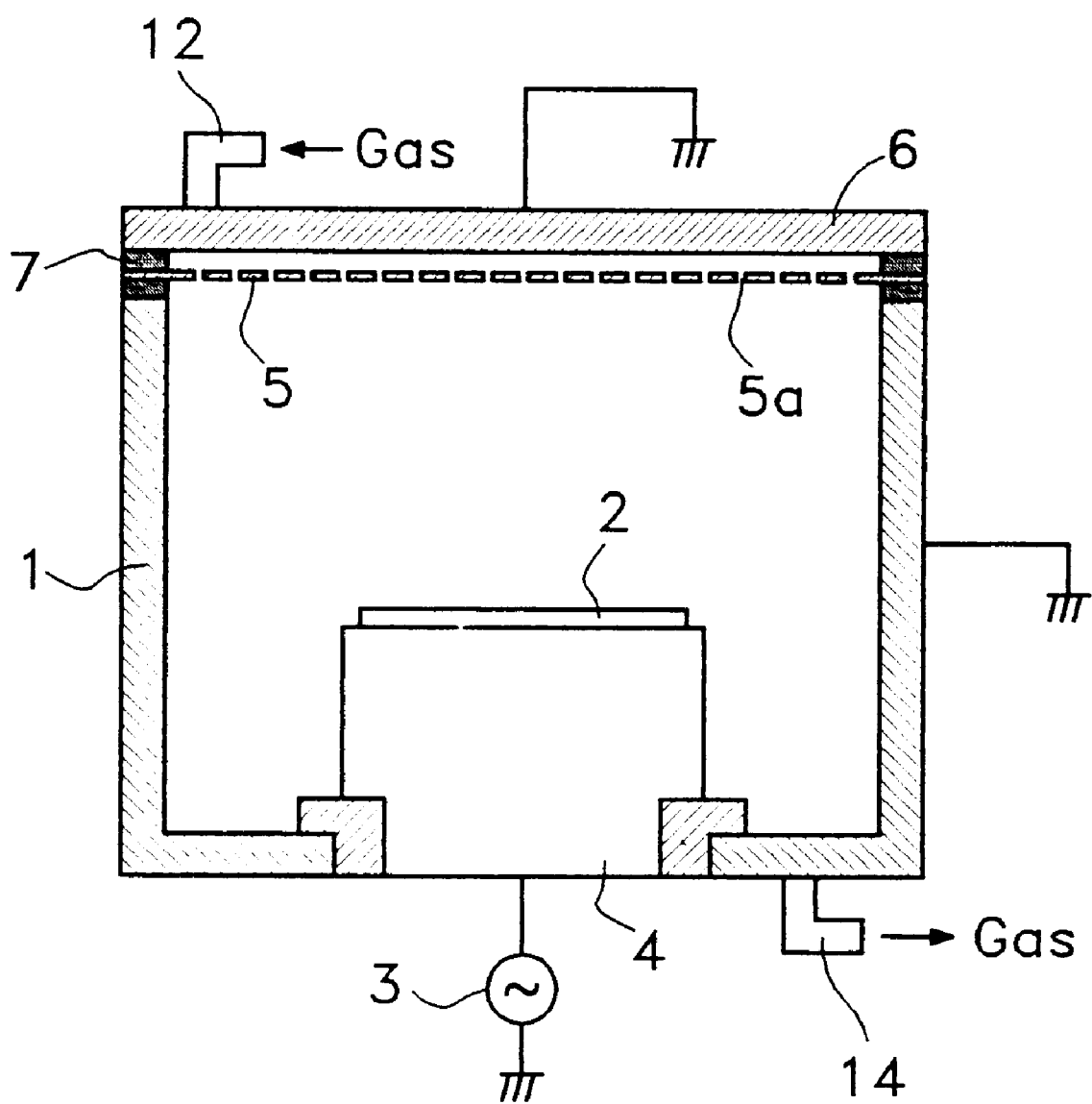
FIG. 3 is a schematic sectional view of an embodiment of the plasma etching apparatus according to the present invention.

Referring to FIG. 3, the plasma etching apparatus includes a vacuum chamber 1, in which a semiconductor substrate 2 is positioned generally as shown. The semiconductor substrate 2 may have a polycrystal silicon thin film formed on the surface thereof, and a photoresist pattern formed on the polycrystal silicon thin film, to serve as an etching mask. The semiconductor substrate 2 is supported on a cathode 4, which is connected to a high-frequency power supply 3. A grounded top lid 6 is mounted atop the chamber and is opposed to the substrate 2. A gas distribution plate 5 (GDP) is installed beneath the top lid 6 and is spaced apart therefrom. A plurality of gas nozzles are formed in the GDP 5 to uniformly introduce a reactive etching gas onto the substrate 2. According to the present invention, the GDP 5 is electrically isolated from the top lid 6 and the sidewalls of the chamber 1 by an insulator 7 interposed therebetween. As a result, the GDP 5 does not have any electrical polarity. Preferably, the insulator 7 is a material which is both electrically insulating and which is resistant to attack by the plasma.

The vacuum chamber 1 further includes a gas exhausting device 14 for discharging gas therefrom and a gas inletting device 12 for introducing an etching gas thereinto.

The etching process using such a plasma etching apparatus is as follows. First, a flow of an etching gas is introduced into the space between the top lid 6 and the GDP 5 through the gas inletting device 12. The etching gas is then uniformly introduced into the chamber 1 through the gas nozzles 5a. The flow of gas is discharged from the chamber through the gas exhausting device 14. Thereafter, a high-frequency voltage is applied to the cathode 4 and the top lid 6 by the high frequency power supply 3. The resulting glow discharge activates the etching gas, creating a plasma of activated neutral molecules and ions. The plasma then etches the exposed portions of substrate 2, forming the desired pattern.

Figure 1:
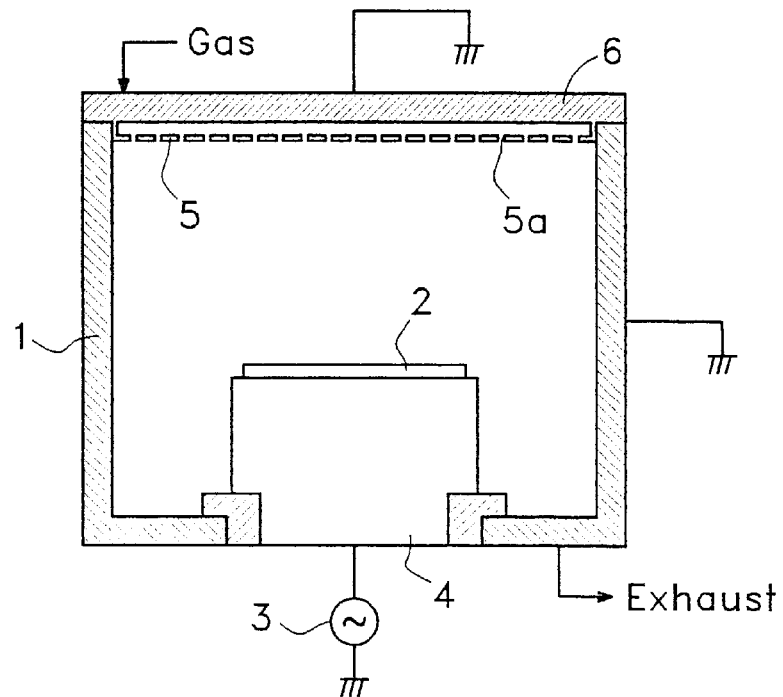
FIG. 1 is a schematic sectional view of a conventional plasma etching apparatus.
Figure 2:
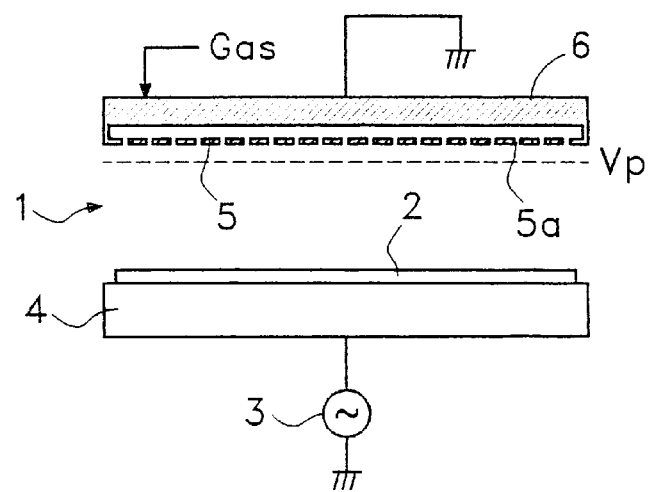
FIG. 2 is a schematic sectional view of the apparatus of FIG. 1, showing the secondary potential generated in the same.

As mentioned above, in prior art apparati and processes, secondary potentials $V_p$ are formed in the area under the GDP 5 in the chamber 1 (FIG. 2). The secondary potentials $V_p$ repeatedly increase and discharge to the GDP 5. The periodic discharges take the form of arcing to the gas nozzles 5a. Unwanted contaminant particles are generated by the arcing which ultimately contaminate and degrade the surface of the substrate. However, a plasma etching apparatus according to the present invention does not present this problem since the GDP 5 is electrically isolated from the top lid 6. As a result, secondary potentials $V_p$ are not discharged to ground through GDP 5, and the arcing to nozzles 5a and the resulting substrate contamination are avoided. As an added benefit, the elimination of the periodic arcing results in a more stable, uniform plasma, which further enhances the uniformity and quality of the processed surface of the wafer.

Figure 4A:
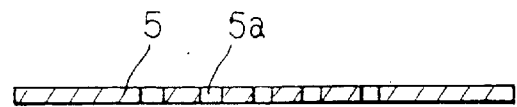
FIG. 4a is a schematic sectional view of a first embodiment of the gas distribution plate according to the present invention.

The plasma etching apparatus having the GDP according to the present invention will be described in greater detail with reference to FIGS. 4a, 4b and 4c. Referring to FIG. 4a, in one aspect of the invention, the GDP 5 is formed of an insulating material, e.g. a ceramic material such as SiC, $SiO_2$ or quartz, although the invention is not limited thereto. Those skilled in the art will recognize that other insulating materials having suitable properties could be employed as well.

Figure 4B:
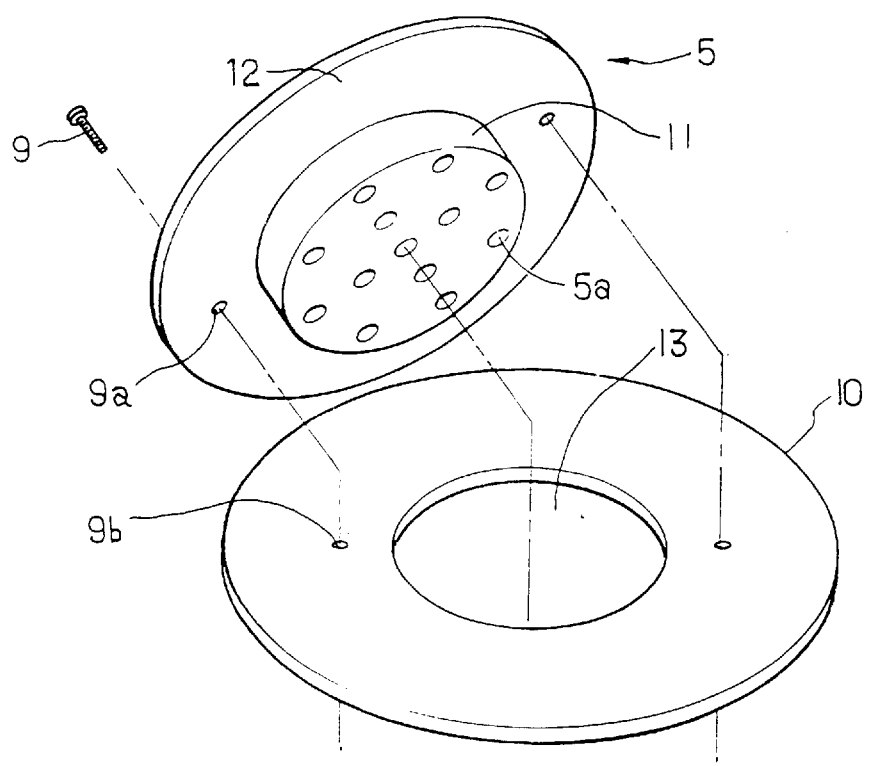
FIG. 4b is an exploded perspective view of a second embodiment of the gas distribution plate according to the present invention.
Figure 4C:
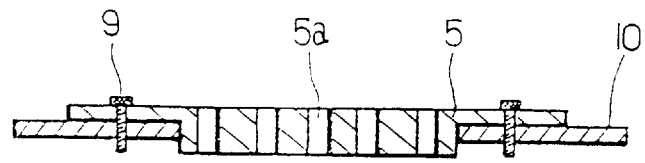
FIG. 4c is a schematic sectional view of the gas distribution plate of FIG. 4b.
Figure 5:
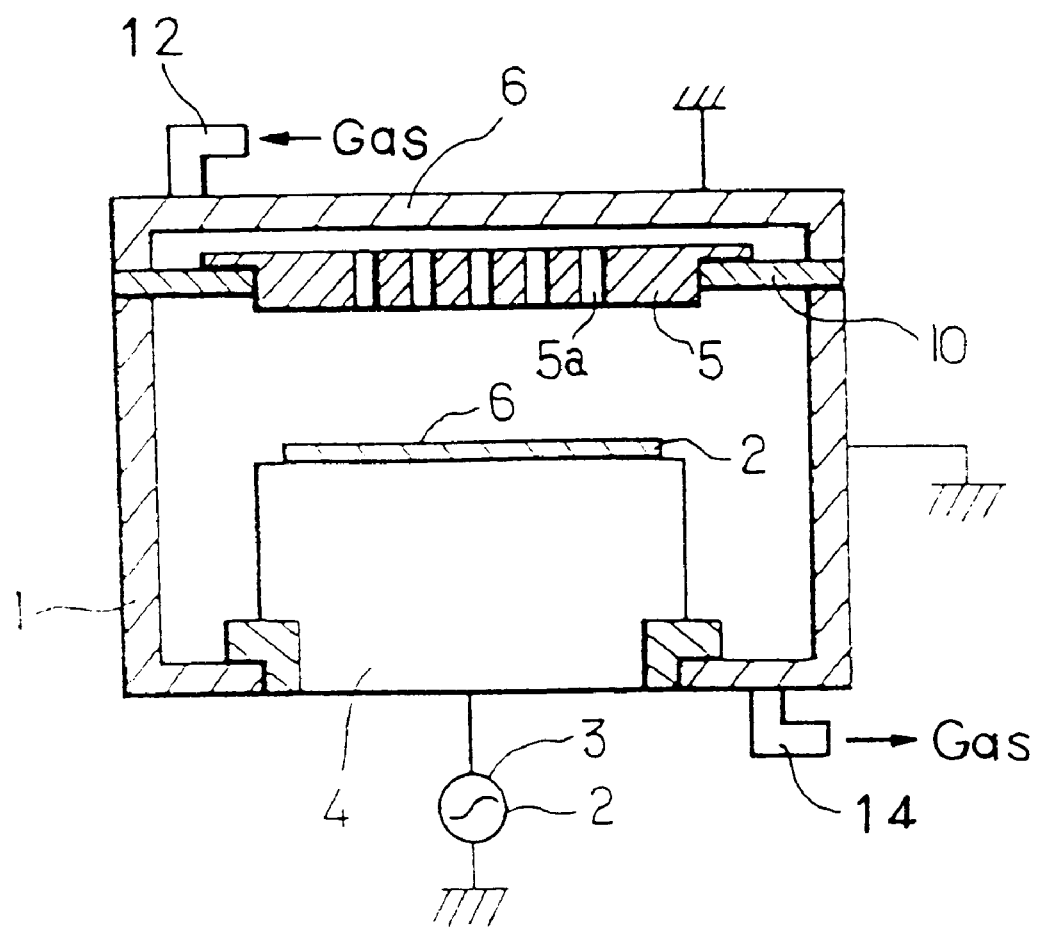
FIG. 5 is a schematic sectional view of the plasma etching apparatus having the gas distribution plate of the first and the second embodiment according to the present invention.

Referring to FIG. 4b, in a second embodiment of the invention, the GDP 5 is detachably coupled with a support plate 10 which in turn is atop the chamber 1. The GDP 5 includes a first circular plate 11 having a plurality of gas nozzles 5a therein; and a second circular plate 12 having a peripheral flange surface extending outwardly from circular plate 11. Preferably, the first circular plate 11 is about twice as thick as the second circular plate 12, and the circular plates 11 and 12 are formed in a whole body. The second circular plate 12 has a plurality of screw holes 9a at predetermined locations for receiving attachment screw.

According to the invention, circular plates 11 and 12 is formed of a material having a high insulating characteristic, e.g. a ceramic material (SiC, $SiO_2$ and so on) or quartz. As a result, the GDP 5 does not require any coating process for applying an insulator to the surface thereof.

The support plate 10 includes a central hole 13 sized to receive plate 11, and a plurality of screw holes 9b at the locations corresponding to the screw holes 9a of the second circular plate 12. Moreover, it is preferable that the surface of the support plate 10 is soft anodized and has an insulating characteristic.

The method of installing the GDP 5 to the support plate 10 will be described in the reference to FIG. 4c. First, the first circular plate 11 of the GDP 5 is inserted into the hole 13 of the support plate 10. The GDP 5 is coupled with the support plate 10 by driving insulating screws 9 into the screw holes 9a and 9b of the second circular plate and the support plate. Thereby, the particle occurrence in association with the movement of the GDP 5 can be prevented. Moreover, it is easier to separate the GDP 5 from the support plate 10 when the GDP 5 needs to be washed.

The plasma etching apparatus in which the GDP 5 according to the first and the second embodiments of the invention operates as follows. First, a flow of etching gas is introduced into the vacuum chamber 1 through the gas inletting device 12. At steady state operation, a corresponding flow gas is discharged from the chamber through the gas exhausting device 14. The etching gas collects in the space between the top lid 6 and the GDP 5, and is then uniformly introduced into the chamber 1 through the gas nozzles 5a formed in the GDP 5. Thereafter, a high-frequency voltage is supplied to the cathode 4 and the top lid 6 by the high frequency power supply 3. A glow discharge is created, generating a plasma from the etching gas in chamber 1 is activated and creates plasma. The substrate 2 is etched and patterned by the plasma according to principles well-known to those skilled in the art.

Meanwhile, secondary potentials $V_p$ are generated in the area beneath the GDP 5 by the presence of polymers in the chamber 1. However, since according to the present invention, the GDP 5 is either formed of an insulating material, and is electrically isolated from the vacuum chamber, the nozzles 5a offers no discharge path to ground. As a result, the troublesome arcing to nozzles 5a which is experienced in prior art processes and equipment is avoided. Consequently, the substrate can be protected from damage that may be caused by the particles in association with the discharges. It is also possible to prevent disruptive flustuations of the plasma state which would otherwise result from the arcing.

The present invention is not limited to the above-described embodiments. Various changes and modifications may be effected by one having an ordinary skill in the art and remain within the scope of the invention, as defined by the appended claims.

We claim:

1. A plasma processing apparatus comprising:
   a vessel having surfaces defining a vacuum chamber;
   a gas inlet and a gas outlet communicating with the vacuum chamber;
   a first electrode communicating with the vacuum chamber;
   a second electrode communicating with the vacuum chamber and spaced apart from the first electrode;
   a workpiece support for supporting a workpiece between the first and second electrodes;

a perforated flat gas distributor disposed between the first and second electrodes; and an insulating support member disposed at an inner wall of said chamber and coupled to said gas distributor, for supporting said gas distributor.

2. The plasma processing apparatus of claim 1, wherein the first electrode is a cathode.

3. The plasma processing apparatus of claim 2, wherein the cathode is connected to a DC (Direct Current) power supply.

4. The plasma processing apparatus of claim 2, wherein the cathode is connected to an RF (Radio Frequency) power supply.

5. The plasma processing apparatus of claim 1, wherein the second electrode is connected to a ground potential.

6. The plasma processing apparatus of claim 1, wherein the gas distribution plate includes a plurality of gas nozzles.

7. The plasma processing apparatus of claim 1, wherein the insulating support member further comprises a plasma-resistant material.

8. The plasma processing apparatus of claim 1, wherein the workpiece is a semiconductor substrate.

9. The plasma processing apparatus of claim 1 wherein the plasma processing apparatus is a chemical vapor deposition apparatus.

10. The plasma processing apparatus of claim 1 wherein the second electrode comprises at least a portion of the vessel.

11. The plasma processing apparatus of claim 10 wherein the second electrode comprises an upper inner surface of the vacuum chamber.

12. The plasma processing apparatus of claim 11 wherein the upper inner surface of the vacuum chamber comprises a removeable lid.

13. The plasma processing apparatus of claim 1 wherein the workpiece support comprises a surface of the first electrode.

14. The plasma processing apparatus of claim 1 wherein the gas distributor plate comprises an insulative outer layer.

15. The plasma processing apparatus of claim 1 wherein the insulating support member is interposed between the gas distributor and the second electrode.

16. A plasma processing apparatus comprising:

a vessel having surfaces defining a vacuum chamber;

a gas inlet and a gas outlet communicating with the vacuum chamber;

a first electrode communicating with the vacuum chamber;

a second electrode communicating with the vacuum chamber and spaced apart from the first electrode;

a workpiece support for supporting a workpiece between the first and second electrodes;

a gas distributor assembly comprising an insulating support member, and a perforated flat gas distributor plate mounted to the insulating support member and disposed between the first and second electrodes; and the insulating support member disposed at an inner wall of said chamber and coupled to said gas distributor, for supporting said gas distributor.

17. A plasma processing apparatus comprising:

a vacuum chamber;

a gas inletting device for introducing a reactive gas into the chamber;

a first electrode disposed in the chamber and including a surface for supporting a workpiece;

a second electrode disposed in the chamber and opposed to the first electrode;

a gas distributor assembly including an insulating support plate fixed to the chamber, and a perforated flat gas distributor detachably mounted on the insulating support plate and disposed between the first and the second electrodes;

a gas exhausting device for discharging the reactive gas out of the chamber, and the insulating support plate disposed at an inner wall of said chamber and coupled to said gas distributor, for supporting said gas distributor plate.

18. The plasma processing apparatus of claim 17 wherein the gas distribution plate comprises an insulating material.

19. The plasma processing apparatus of claim 18, wherein the gas distribution plate comprises a material is selected from the group consisting of SiC, SiO2, and quartz.

20. The plasma processing apparatus of claim 17, wherein the insulating support plate comprises a soft-anodized aluminum material.

21. The plasma processing apparatus of claim 17, wherein the gas distributor is coupled with the insulting support plate by screws.

* * * * *

UNITED STATES PATENT AND TRADEMARK OFFICE
CERTIFICATE OF CORRECTION

PATENT NO.    : 6,041,733
DATED         : March 28, 2000
INVENTOR(S)   : Kim et al.

It is certified that error appears in the above-identified patent and that said Letters Patent is hereby corrected as shown below:

Column 1,
Line 51, "eletrolytic" should read -- electrolytic --.

Column 4,
Line 48, "flustuations" should read -- fluctuations --.

Column 6,
Line 38, "material is selected" should read -- material selected --.

Signed and Sealed this

Twentieth Day of August, 2002

Attest:

JAMES E. ROGAN
Attesting Officer        Director of the United States Patent and Trademark Office